United States Patent [19]
Tajima et al.

[11] Patent Number: 5,623,190
[45] Date of Patent: Apr. 22, 1997

[54] METHOD AND APPARATUS FOR CONTROLLING AN AC MOTOR AND DETECTING MALFUNCTIONS

[75] Inventors: Hirokazu Tajima; Hidetoshi Umida, both of Tokyo, Japan

[73] Assignee: Fuji Electric Co., Ltd., Tokyo, Japan

[21] Appl. No.: 307,895

[22] Filed: Sep. 16, 1994

[30]  Foreign Application Priority Data

Sep. 17, 1993  [JP]  Japan ................................ 5-230648
May 11, 1994  [JP]  Japan ................................ 6-097089

[51] Int. Cl.$^6$ .................................................. H02P 5/00
[52] U.S. Cl. ............................................. 318/800; 318/812
[58] Field of Search .................................. 318/798–815, 318/490, 609, 610; 361/23, 24, 31; 363/40, 49, 43

[56]  References Cited

U.S. PATENT DOCUMENTS

| | | | |
|---|---|---|---|
| 4,442,393 | 4/1984 | Abbondanti | 318/802 |
| 4,680,526 | 7/1987 | Okuyama et al. | 318/802 |
| 4,764,712 | 8/1988 | Blachke et al. | 318/805 X |
| 4,914,386 | 4/1990 | Zocholl | 318/490 X |
| 5,160,878 | 11/1992 | Nagano | 318/800 |
| 5,278,485 | 1/1994 | Kim | 318/802 |
| 5,341,081 | 8/1994 | Yamada | 318/800 |

FOREIGN PATENT DOCUMENTS

| | | |
|---|---|---|
| 0500121 | 2/1992 | European Pat. Off. . |
| 3820125 | 6/1988 | Germany . |
| 2241389 | 3/1989 | Japan . |
| 5030792 | 7/1991 | Japan . |

*Primary Examiner*—Jonathan Wysocki
*Attorney, Agent, or Firm*—Brumbaugh, Graves, Donohue & Raymond

[57]  ABSTRACT

Disclosed are methods and apparatus for quickly measuring a primary resistance value of an AC motor without using high precision detectors and detecting malfunctions such as breaking of wire in the AC motor or in a power converting mechanism, open phase, and three-phase unbalance. A voltage drop attributable to the primary resistance of the AC motor can be estimated by using an estimated resistance value $R_1^{\#}$, which is estimated in turn by an integral or proportional-plus-integral operation on the deviation between a detected magnetizing current value $I_M$ and a reference magnetizing current value $I_M^*$, in place of an actual primary resistance value $R_1$. The time for the estimated resistance value $R_1^{\#}$ to reach the true primary resistance value is reduced with a varying reference magnetizing current value $I_M^{**}$. Variations of the estimated primary resistance values $R_1^{\#}$s between the phases are corrected with a mean estimated primary resistance value $R_{1M}^{\#}$ according to a reference phase value $\phi^*$. Malfunctions such as open phase and breaking of wire are detected by comparing estimated primary resistance values obtained according to the reference phase value $\phi^*$.

13 Claims, 7 Drawing Sheets

METHOD AND APPARATUS FOR CONTROLLING AN AC MOTOR AND DETECTING MALFUNCTIONS

BACKGROUND OF THE INVENTION

1. Field of the Invention

The present invention relates to a method for controlling an AC motor which facilitates detection of the primary resistance of the AC motor with excellent accuracy, and more particularly to a method for controlling an AC motor which facilitates detection of a malfunction by comparing the estimated primary resistance value of each phase.

2. Description of the Prior Art

Magnetic flux and torque of an AC motor can be controlled by resolving a current flowing through the AC motor into a magnetizing current component parallel to the magnetic flux and a torque current component perpendicular to the magnetic flux, and by controlling the magnetizing current and the torque current components independently. It is well known that speed of the AC motor can be controlled highly accurately by the so-called transvector control method that treats the current of the AC motor as a vector consisted of two components.

According to this method, the AC motor is controlled by putting an equivalent-circuit of the AC motor as a control model. Control constants based on the equivalent circuit constants are then pre-set to a control apparatus. Usually, the design values of the motor constants are used as the control constants. However, there are differences between the design and actual values of the motor constants, which cause control errors. Variations of the motor constants during operation of the motor also cause control errors. Furthermore, the transvector control method cannot be applied when the constants of the motor already in service are unknown.

In the transvector control method, induced electromotive force which relates to the magnetic flux must be determined. The induced electromotive force is calculated by subtracting the voltage drop attributable to the internal impedance of the motor from the terminal voltage of the motor. The voltage drop attributable to the internal impedance of the motor is obtained by multiplying the magnetizing current component and a primary resistance value of the motor. A drawback of the transvector control method is that generated torque becomes insufficient, especially when the motor is driven at low speeds, because an appropriate output reference voltage value cannot be calculated when the primary resistance value is different from the pre-set value.

To solve this problem, a method to obtain the primary resistance value by dividing output voltage by a phase current of predetermined value flowing through the motor has been proposed. (See RM-85-26, Technical Meeting Paper on Rotating Machine, p. 65, Institute of Electrical Engineers of Japan.) This method, however, requires high precision detectors. Further, since the primary resistance value of a large capacity motor is small, the high precision detectors would not improve accuracy of the measurements. Moreover, in the transient period, induced electromotive force by magnetizing inductance is added to the voltage drop attributable to the primary resistance. Since decay time of the induced electromotive force is prolonged in an AC motor having a large secondary time constant, e.g., a large capacity AC motor, the resistance value obtained by dividing output voltage by a current requires time to reach a true primary resistance value. Additionally, the motor windings and/or the semiconductor switching elements of the power converter are different depending on a phase angle of voltage applied to the AC motor. Therefore, the resistance values of the motor windings and/or the semiconductor switching elements vary. Because of these variations, the measured primary resistance value varies depending on the phase angle difference, further causing control errors.

In view of the foregoing, an object of the present invention is to provide a control method that measures the primary resistance of an AC motor with high accuracy in a short time.

It is another object of the present invention to provide a control method that measures, without using high precision detectors, the primary resistance of an AC motor with high accuracy in a short time by eliminating the errors caused by the phase angle difference.

It is yet another object of the present invention to provide a control method which facilitates detection of malfunctions such as breaking of wiring, open phases and three-phase unbalance of the AC motor or the power converting means.

SUMMARY OF THE INVENTION

The objects of the present invention are achieved by providing a control apparatus and a control method for an AC motor, which method involves, initial steps of: resolving a detected value of a current flowing through the AC motor into a magnetizing current component parallel to magnetic flux and a torque current component perpendicular to the magnetic flux, executing a control operation for equalizing the magnetizing current component to a predetermined reference magnetizing current value, obtaining a reference magnetizing voltage value by adding a result of the control operation and voltage drop through primary resistance of the AC motor, and driving the AC motor at a desired speed with AC electric power output from a power converter controlled with the reference magnetizing voltage value and a reference torque voltage value. The control method additionally includes steps of: obtaining an estimated resistance value from an integral operation or from a proportional plus integral operation on the deviation of the magnetizing current component from the reference magnetizing current value obtaining an estimated voltage drop through the primary resistance by multiplying the estimated resistance value and the reference magnetizing current value, obtaining the reference magnetizing voltage value by adding the estimated voltage drop and the result of the control operation, and controlling the power converter with the obtained reference magnetizing voltage value.

The objects of the present invention are achieved also by providing a control apparatus and a control method for a three-phase AC motor, which method involves, intial steps of: resolving a detected value of a current flowing through of the AC motor into a magnetizing current component parallel to magnetic flux and a torque current component perpendicular to the magnetic flux, executing a control operation for equalizing the magnetizing current component to a predetermined reference magnetizing current value, obtaining a reference magnetizing voltage value by adding a result of the control operation and voltage drop through primary resistance of the AC motor, and driving the three-phase AC motor at a desired speed with AC electric power output from a power converter controlled with the reference magnetizing voltage value and a reference torque voltage value. The control method additionally includes steps of: obtaining estimated resistance values from integral operations or from proportional plus integral operations on the deviations of the magnetizing current components from the reference magnetizing current value for each of six sets of currents of two phases of the three-phase AC motor supplied by actions of one switching element on a positive side and another switching element on a negative side of the power converter, calculating a mean resistance value of the estimated six resistance values, obtaining estimated voltage drop through the primary resistance by multiplying the mean resistance value and the reference magnetizing current value, obtaining an reference magnetizing voltage value by adding the estimated voltage drop and the result of the control operation, and controlling the power converter with the obtained reference magnetizing voltage value.

The objects of the present invention are achieved also by providing a control apparatus and a control method for a three-phase AC motor, which method involves intial steps of: resolving a detected value of a current flowing through the AC motor into a magnetizing current component parallel to magnetic flux and a torque current component perpendicular to the magnetic, flux, executing a control operation for equalizing the magnetizing current component to a predetermined reference magnetizing current value, obtaining a reference magnetizing voltage value by adding a result of the control operation and voltage drop through primary resistance of the AC motor, and driving the three-phase AC motor at a desired speed with AC electric power output from a power converter controlled with the reference magnetizing voltage value and a reference torque voltage value. The control method additionally includes malfunction detection steps of: obtaining at least three estimated resistance values from integral operations or from proportional plus integral operations on the deviations of the magnetizing current components from the reference magnetizing current value for each of at least three sets of currents of two phases of the three-phase AC motor supplied by actions of one switching element on a positive side and another switching element on a negative side of the power converter; comparing the estimated resistance values with each other; and identifying a malfunction based on a difference between the estimated resistance values which exceeds a predetermined value.

DETAILED DESCRIPTION

Figure 1:
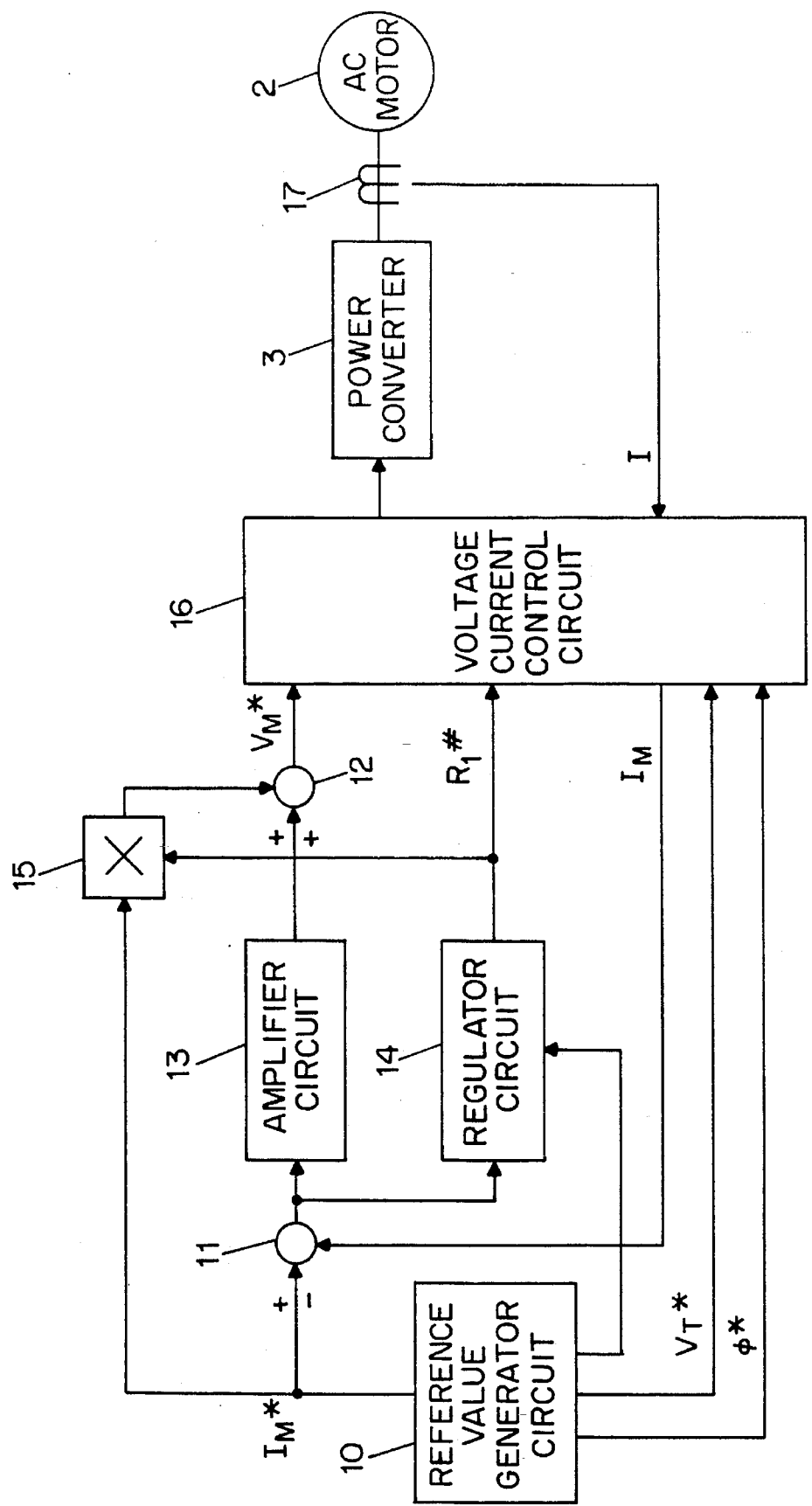
FIG. 1 is a block diagram showing a control apparatus according to the first embodiment of the present invention.

As shown in FIG. 1, a block diagram of a cpmtrp; apparatus according to the first embodiment of the present invention, the estimated primary resistance $R_1^\#$ is obtained by an integral operation or a proportional-plus-integral operation on the difference between a reference magnetizing current value $I_M^*$ and a detected magnetizing current value $I_M$. The voltage drop through the primary resistance is then estimated by multiplying the estimated primary resistance value $R_1^\#$ and the reference magnetizing current value $I_M^*$. Further, a reference magnetizing voltage value $V_M^*$ is obtained by adding an amplified deviation of the reference magnetizing current value $I_M^*$ from the detected magnetizing current value $I_M$ and the estimated voltage drop value. The reference magnetizing voltage value $V_M^*$ is expressed by a following equation 1. The estimated primary resistance $R_1^\#$ is expressed by a following equation 2 or 3. In these equations, $K_A$ is a proportional gain of an amplifying means, $K_P$ a proportional gain of a proportional plus integral means, and $K_I$ an integral gain of an integral means or the proportional plus integral means.

$$V_M^* = K_A(I_M^* - I_M) + R_1^\# \cdot I_M^* \tag{1}$$

$$R_1^\# = K_I \int (I_M^* - I_M) \cdot dt \tag{2}$$

$$R_1^\# = K_P(I_M^* - I_M) + K_I \int (I_M^* - I_M) \cdot dt \tag{3}$$

In a steady state, the following equation 4 holds:

$$I_M = V_M^* / R_1 \tag{4}$$

The following equation 5 is then obtained from equations 1 and 4.

$$I_M = \frac{K_A + R_1^\#}{K_A + R_1} \cdot I_M^* \tag{5}$$

Since, in equations 2 and 3, the estimated primary resistance value $R_1^\#$ increases when the deviation between the reference and detected magnetizing current values $(I_M^* - I_M)$ is positive and $R_1^\#$ decreases when the deviation $(I_M^* - I_M)$ is negative, the reference magnetizing voltage value $V_M^*$ is corrected by equation 1. Therefore, when the deviation $(I_M^* - I_M)$ approaches zero, the estimated primary resistance value $R_1^\#$ will approach the actual primary resistance value $R_1$ from equation 5.

Also seen in FIG. 1 current detector 17 detects a current flowing from a power converter 3 to an AC motor 2. A voltage current-control circuit 16 resolves the detected current value I into a detected magnetizing current value $I_M$ and a detected torque current value $I_T$ orthogonal to each other. Since the torque current value $I_T$ and a reference torque voltage value $V_T^*$ do not relate to the present invention, their explanations are omitted.

Adder 11 calculates the deviation of a reference magnetizing current value $I_M^*$ output from a reference value generator circuit 10 and the detected magnetizing current value $I_M$, and outputs the calculated deviation to an amplifier circuit 13 and a regulator circuit 14 comprised of an integral or a proportional-plus-integral circuit. Since the estimated primary resistance value $R_1^\#$ coincides with the actual primary resistance value $R_1^\#$ when deviation of the reference magnetizing current value $I_M^*$ from the detected magnetizing current value $I_M$ is zero, i.e. $I_M^*=I_M$, as equation 5 expresses, the regulator circuit 14 outputs the estimated primary resistance value $R_1^\#$, which becomes identical to the actual primary resistance value $R_1$. Multiplier 15 multiplies the obtained estimated primary resistance value $R_1^\#$ and the reference magnetizing current value $I_M^*$ to obtain the voltage drop through the primary resistance. A reference magnetizing voltage value $V_M^*$ is obtained, as equation 1 expresses, by an adder 12 which adds the voltage drop and the output from amplifier circuit 13. The reference torque voltage value $V_T^*$ is also used for controlling the power converter 3 through the voltage current control circuit 16. In FIG. 1, $\phi^*$ designates a reference phase value.

Figure 2:
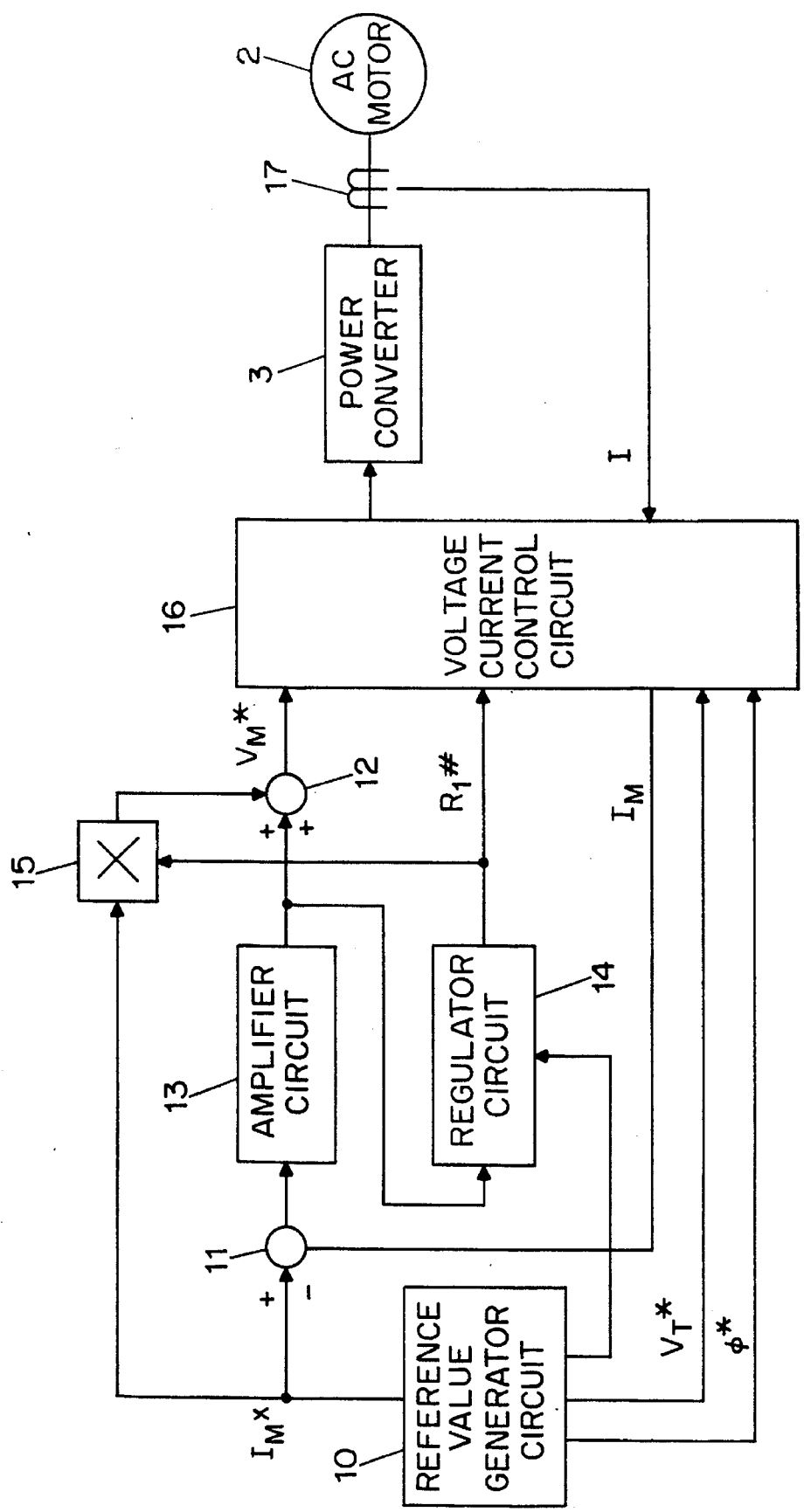
FIG. 2 is a block diagram showing a control apparatus according to the second embodiment of the present invention.

For the second embodiment of the present invention, the theoretical background provided for the first embodiment is also applicable. As seen in FIG. 2, a block diagram of a control apparatus according to the second embodiment, the circuit is configured similarly as the first embodiment illustrated in FIG. 1 except that the output signal from the amplifier circuit 13 is fed to the regulator circuit 14 comprised of an integral circuit or a proportional plus integral circuit. As FIG. 2 shows, the same effect is obtained regardless of whether the input signal to the regulator circuit 14 is a calculation result of adder 11 or an amplified calculation result of an adder 11 amplified through the amplifier circuit 13.

The first and second embodiments are superior to the prior art since they facilitate estimating the primary resistance value $R_1^\#$ without being affected by the detector precision even when the resistance value varies with temperature rise. These embodiments also compensate for wiring resistance between the power converting means and the AC motor, as well as compensate for the voltage drop caused by the switching elements. Finally, these embodiments are effective for safely estimating the primary resistance because they simultaneously conduct current control.

As described above, because the decay time of the induced electromotive force is prolonged in an AC motor having a large secondary time constant, e.g., a large capacity AC motor, substantial time is required for the resistance value obtained from dividing the output voltage by a current to reach a true primary resistance value. To solve this problem, the third embodiment utilises a previously determined reference-magnetizing-current pattern, in which the reference magnetizing current value $I_M^*$ decreases from an initial large value at the start of the AC motor to a predetermined value after a predetermined period of time has elapsed. As a result, the time required for estimating the primary resistance value is shortened because an actual magnetizing current escalates immediately after the start of the AC motor. Thus, the influence of the induced electromagnetic force to the voltage drop through the primary resistance is reduced.

Figure 3:
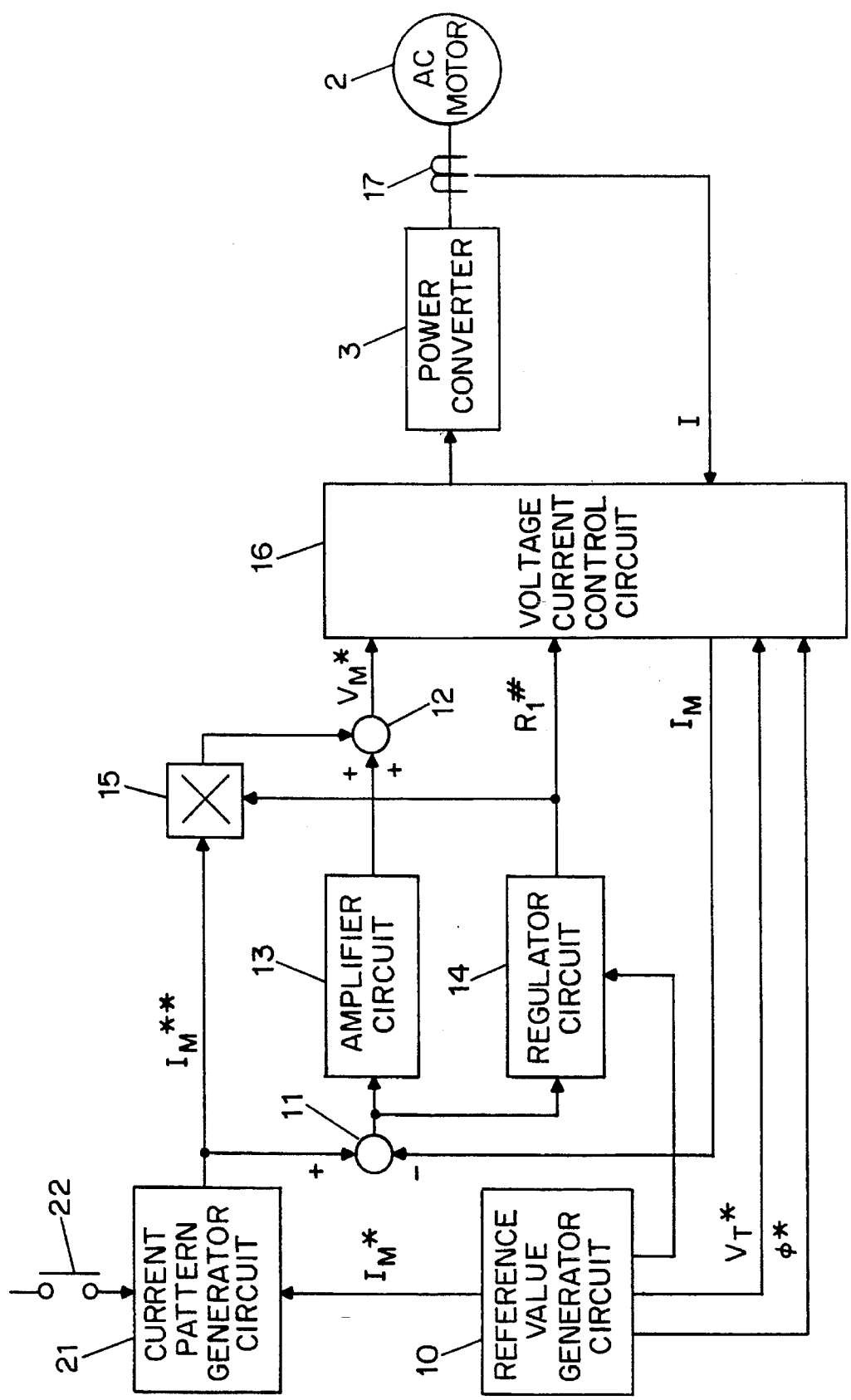
FIG. 3 is a block diagram showing a control apparatus according to the third embodiment of the present invention.

Shown in FIG. 3 is a block diagram of a control apparatus according to the third embodiment of the present invention. In the third embodiment of FIG. 3, the names, functions and applications of the AC motor 2, the power converter 3, the reference value generator circuit 10, the adders 11 and 12, the amplifier circuit 13, the regulator circuit 14, the multiplier 15, the voltage current control circuit 15 and the current detector 17 are substantially similar as those in the first embodiment of FIG. 1, and their explanations as applicable to this embodiment are referenced herein.

The third embodiment differs from the first embodiment in that the third embodiment converts the reference magnetizing current value $I_M^*$ output from the reference-value-generator circuit 10 through current pattern generator 21 to a varying reference magnetizing current value $I_M^{**}$. The third embodiment differs from the first embodiment in that an operation command switch 22 is incorporated. Though the calculation result of the adder 11 is inputted into the regulator circuit 14 as in the first embodiment, the amplified result of the amplifier 13, i.e., the amplification of the calculation result of the adder 11, may be inputted to the regulator circuit 14 as in the second embodiment.

Additionally, in the third embodiment, a start command indicating the start point of the AC motor 2 is inputted to the current-pattern generator 21 through the operation command switch 22. The current-pattern generator 21 outputs, in response to the inputted start command, the varying reference magnetizing current value $I_M^{**}$ which decreases according to the current pattern from the initial large value to a predetermined value after a predetermined period of time has elapsed. Accordingly, this shortens the time for the estimated resistance value to reach the true primary resistance value.

Figure 4:
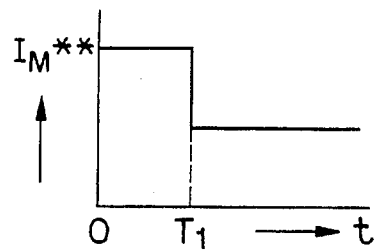
FIG. 4 is a graph showing a first variation example of time variation of an output from the current pattern generator 21 of the third embodiment of FIG. 3.

FIG. 4 is a graph showing a first example of time variation of an output of the current-pattern generator 21 shown in FIG. 3. In FIG. 4, the axis of ordinates represents time and the axis of abscissa the varying reference magnetizing current value $I_M^{}$. The $I_M^{}$ is very large when AC motor 2 starts and decreases to a predetermined value at $T_1$ when a predetermined time has elapsed.

Figure 5:
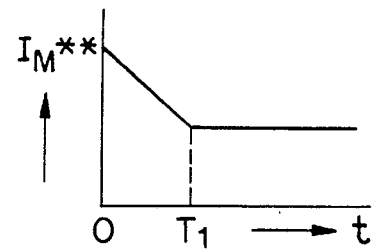
FIG. 5 is a graph showing a second variation example of time variation of an output from the current pattern generator 21 of the third embodiment of FIG. 3.

FIG. 5 is a graph showing a second example of time variation of an output of the current-pattern generator 21 shown in FIG. 3. In FIG. 5, the axis of ordinates represents time and the axis of abscissa the varying reference magnetizing current value $I_M^{}$. The $I_M^{}$ is of a large value when the AC motor 2 starts, i.e., at time zero, decreases linearly with time and reaches the predetermined value at $T_1$ when a predetermined time has elapsed.

Figure 6:
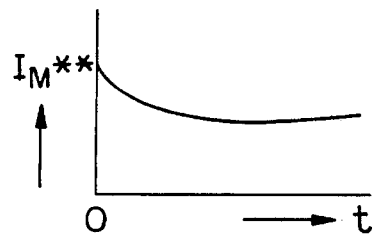
FIG. 6 is a graph showing a third variation example of time variation of an output from the current pattern generator 21 of the third embodiment of FIG. 3.

FIG. 6 is a graph showing a third example of time variation of an output of the current-pattern generator 21 shown in FIG. 3. In FIG. 6, the axis of ordinates represents time and the axis of abscissa the varying reference magnetizing current value $I_M^{}$. The $I_M^{}$ decreases exponentially with time from the initial large value at the time when AC motor 2 starts and finally reaches the predetermined value.

Other embodiments of the present invention, discussed in greater detail below, are control apparatuses for controlling a three-phase AC motor. In the three-phase AC motor, a total resistance value of the winding resistance of each phase, the wiring resistance between the power converting means and the AC motor, and the resistance of the switching elements of the power converting means, is obtained by: (1) switching on one switching element on the positive side and another switching element on the negative side while avoiding pairs which cause arm short circuits; and (2) by measuring six sets of resistance values of two phases of the three-phase AC motor while current flows through. The most appropriate primary resistance value for controlling the AC motor is obtained by calculating a mean value of the total resistance values of all the phases. As in the embodiments previously described, the reference magnetizing current pattern is obtained in which the reference magnetizing current value $I_M^*$ decreases from an initial large value at the time the AC motor starts to a predetermined value after a predetermined period of time has elapsed, and the voltage drop through the primary resistance is obtained by multiplying this varying reference magnetizing current value and the primary resistance value obtained as described above.

Figure 8:
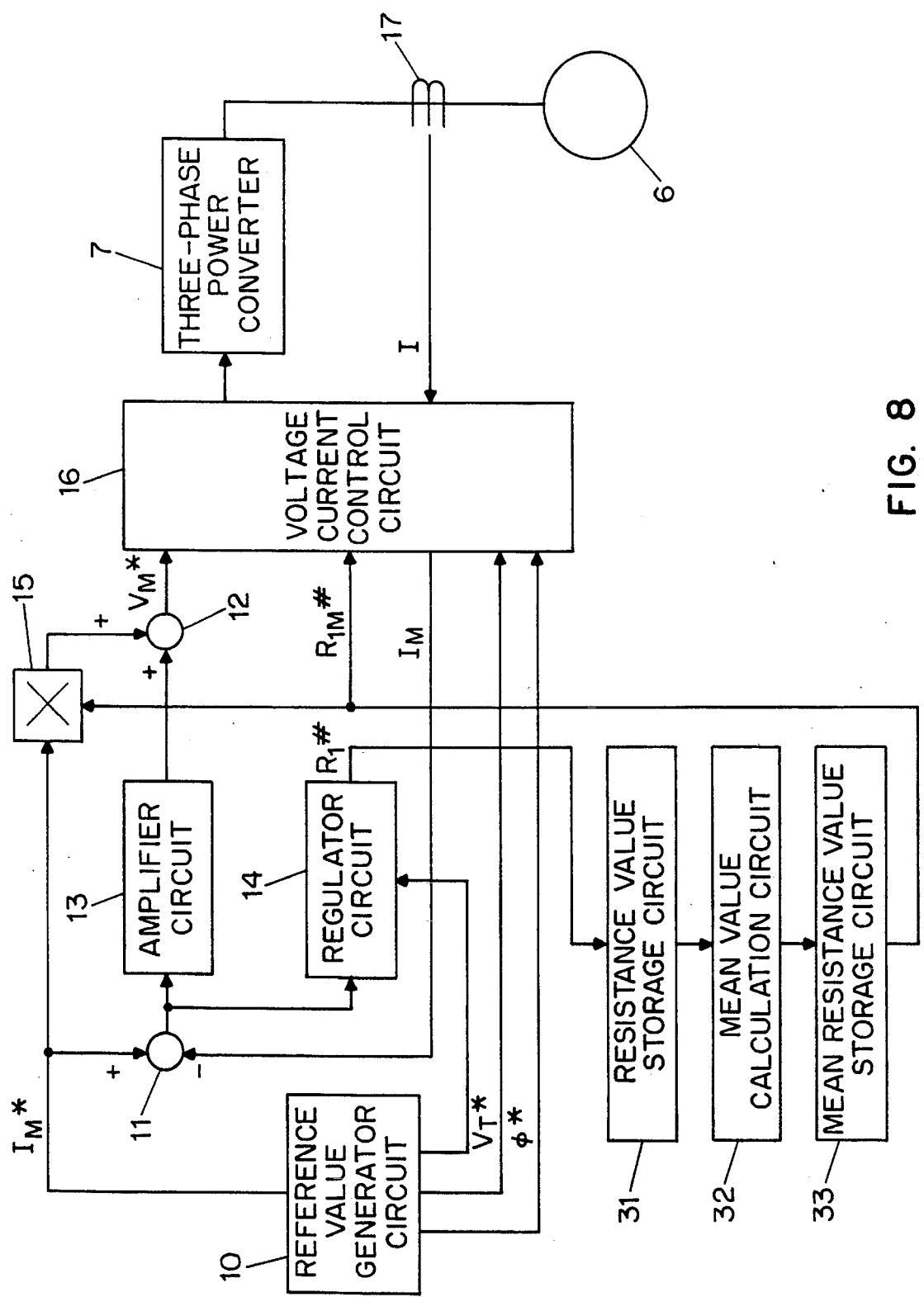
FIG. 8 is a block diagram showing a control apparatus according to the fourth embodiment of the present invention.

As seen in FIG. 8, a block diagram showing a control apparatus according to the fourth embodiment, the names, functions and applications of the reference value generator circuit 10, the adders 11 and 12, the amplifier circuit 13, the regulator circuit 14, the multiplier 15, the voltage/current-control circuit 15 and the current detector 17 are substantially similar to those in the first embodiment of FIG. 1, and their explanations as applicable to this embodiment are referenced herein.

Figure 7:
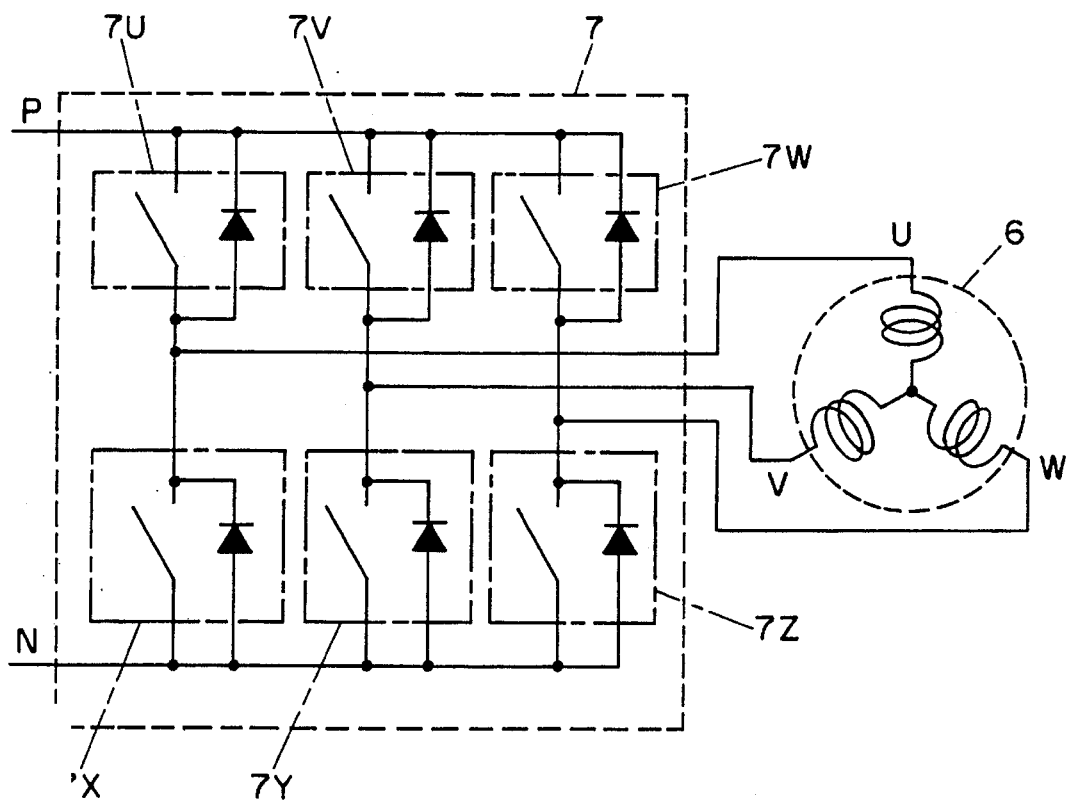
FIG. 7 is a circuit diagram showing connections between a three-phase electric power converter 7, which converts a DC current to a three-phase AC current, and a three-phase AC motor 6 driven by the three-phase electric power supplied from the power converter 7.

In the fourth embodiment, a three-phase electric power converter 7 supplies three-phase AC electric power to three-phase AC motor 6. Shown in FIG. 7 are the connections between the three-phase electric power converter 7, which converts a DC current to a three-phase AC current, and the three-phase AC motor 6 driven by the three-phase electric power supplied from the power converter 7. As FIG. 7 shows, the three-phase electric power converter 7 is constructed by bridge-connecting six switching elements, 7U, 7V, and 7W on the positive side, and 7X, 7Y, and 7Z on the negative side. A current flows through two phases of the three-phase AC motor 6 when one of the switching elements 7U, 7V or 7W on the positive side and one of the switching elements 7X, 7Y or 7Z on the negative side are turned on, while avoiding arm short circuit, that is, simultaneous turning-on of the switching elements which belong to the same phase.

The phases through which a current flows and the switching elements of the power converter 7 to be turned on change with the variation of phase angle of voltage applied to three-phase AC motor 6. Because of this, the actual primary resistance value varies with the variation of the phase angle, which may cause deterioration of control accuracy. To solve this problem, the control apparatus according to the fourth embodiment outputs a reference phase value φ* according to which six sets of the switching elements of the power converter 7 are paired to be simultaneously turned on according to the assignment listed in Table 1.

TABLE 1

Assignment of the switching elements to be simultaneously turned-on

|   | Switching elements to be turned-on | Motor windings through which a current flows |
| --- | --- | --- |
| 1 | 7U, 7Y | U phase→ V phase |
| 2 | 7U, 7Z | U phase→ W phase |
| 3 | 7V, 7X | V phase→ U phase |
| 4 | 7V, 7Z | V phase→ W phase |
| 5 | 7W, 7X | W phase→ U phase |
| 6 | 7W, 7Y | W phase→ V phase |

The estimated primary resistance values $R_1^\#$s for the six sets listed in Table 1, i.e., the output from regulator circuit 14, are stored in a phase-resistance-value storage circuit 31 with reference to each phase angle. Alternatively, one may store converted estimated primary resistance values for each phase in the phase-resistance-value storage circuit 31. A mean-value-calculation circuit then calculates a mean value of the stored data, and the calculated mean primary resistance value $R_{1M}^\#$ is stored in a mean-resistance-value storage circuit 33. The stored mean primary resistance value $R_{IM}^\#$ is used for calculating voltage drop through the primary resistance of the three-phase AC motor 6.

In the fourth embodiment, although the calculation result of adder 11 is inputted to regulator circuit 14 as in the first embodiment, the amplified result of the amplifier 13, i.e., the amplified calculation result of the adder 11, may be inputted to the regulator circuit 14 as in the second embodiment.

Figure 9:
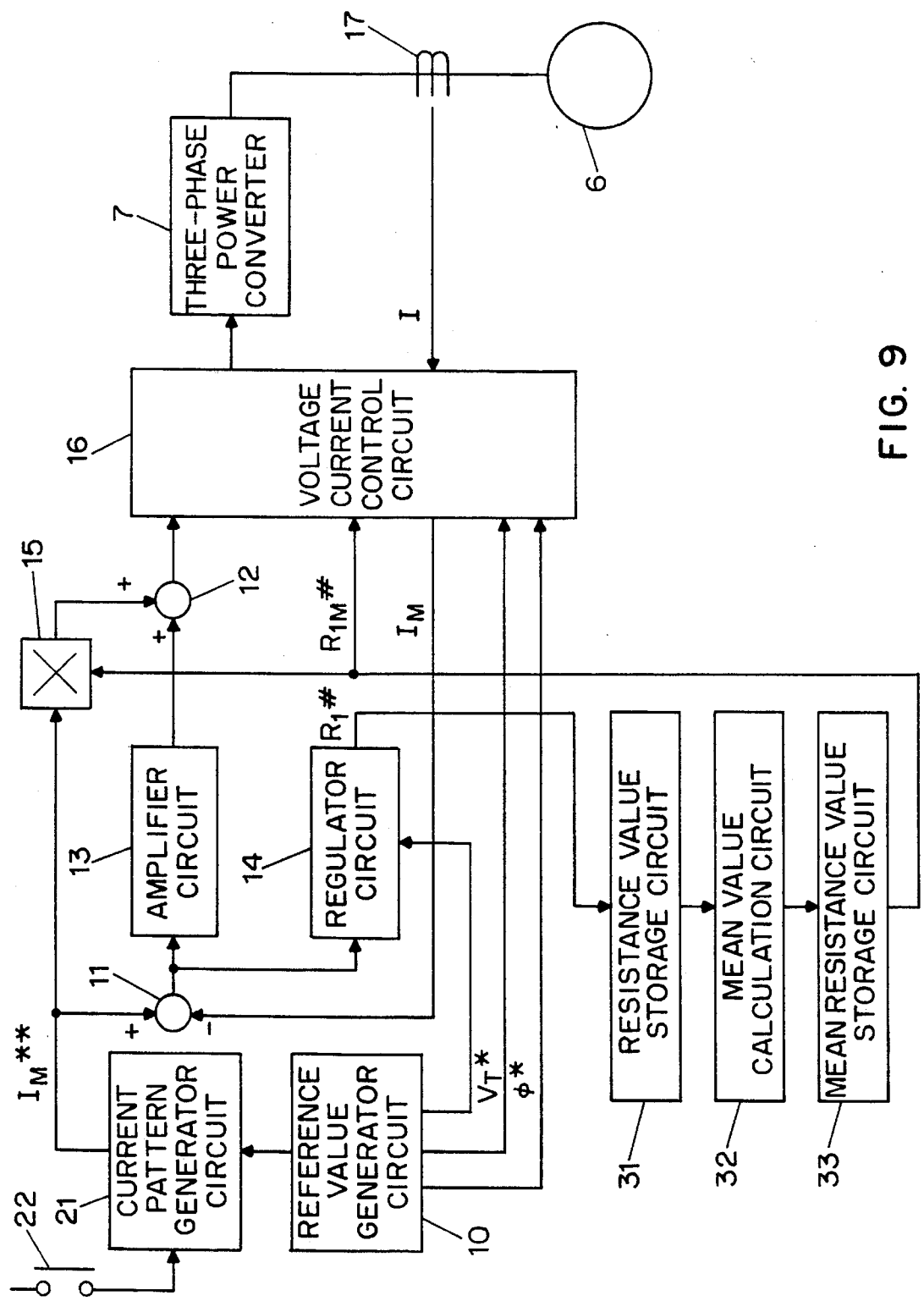
FIG. 9 is a block diagram showing a control apparatus according to the fifth embodiment of the present invention.

As seen in FIG. 9, a block diagram of a control apparatus according to the fifth embodiment, this embodiment is constructed by providing the fourth embodiment with the current-pattern-generator circuit 21 and the operation command switch 22. The functions of current pattern generator circuit 21 and operation command switch 22 are the same as those of the third embodiment of FIG. 3, and the respective functions of other constituent components are the same as those of the fourth embodiment of FIG. 8.

In the fifth embodiment, although the calculation result of the adder 11 is inputted to the regulator circuit 14 as in the first embodiments, the amplified result of the amplifier 13, i.e., the amplified calculation result of the adder 11, may be inputted to the regulator circuit 14 as in the second embodiment.

A control apparatus according to the sixth embodiment facilitates detection of motor malfunctions. In order to achieve this, a total resistance value of the winding resistance of each phase, the wiring resistance between the power converting means and the AC motor, and the resistance of the switching elements of the power converting means is initially obtained as described above. Thereafter, the resistance values of all the phases are compared, and malfunctions such as breaking of wire, open phases and three-phase unbalance of the AC motor or the power converting means are identified.

Figure 10:
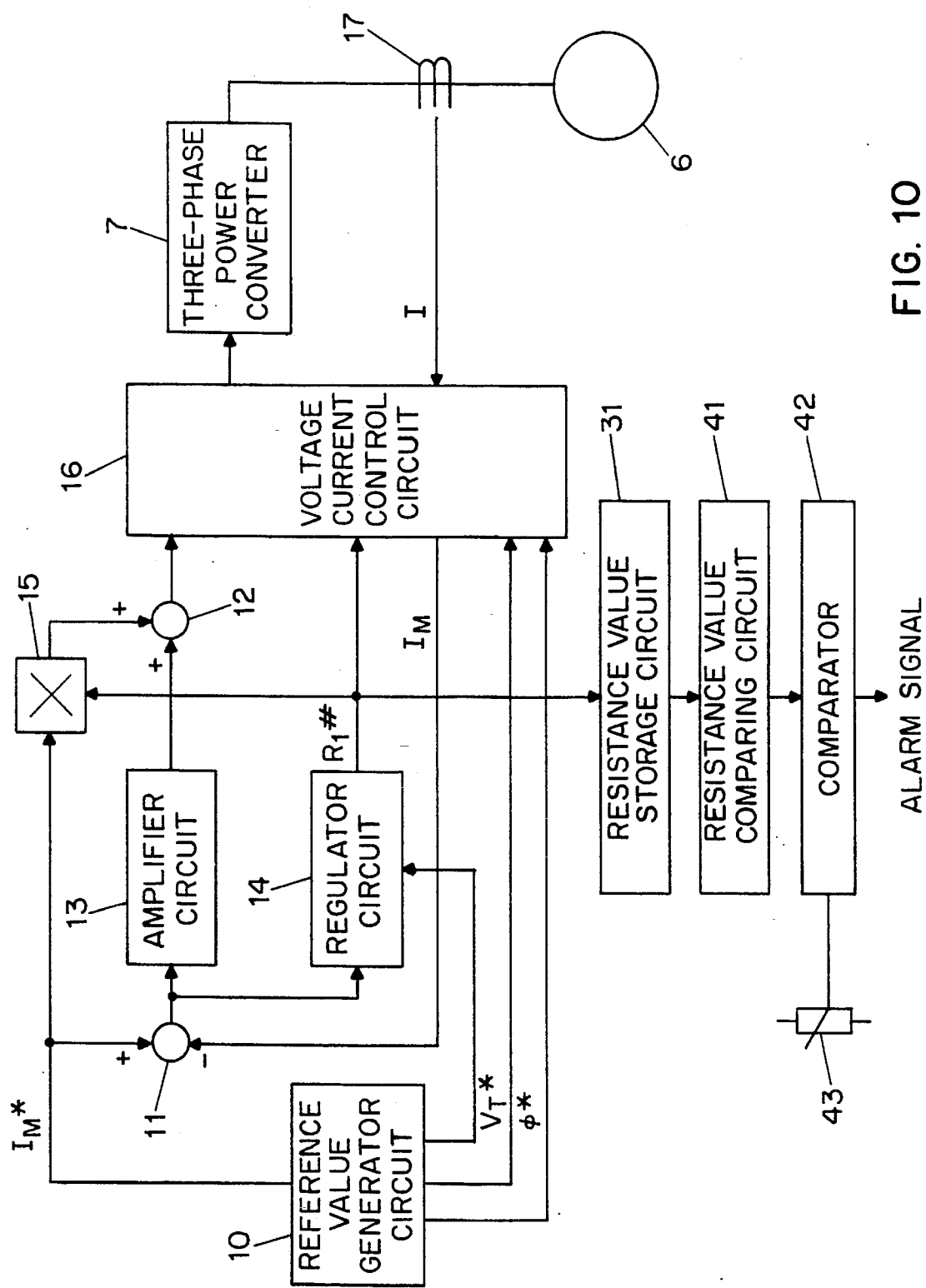
FIG. 10 is a block diagram showing a control apparatus according to the sixth embodiment of the present invention.

As seen in FIG. 10, a block diagram of the control apparatus according to the sixth embodiment, the names, functions and applications of the three-phase AC motor 6, the three-phase electric power converter 7, the reference value generator circuit 10, the adders 11 and 12, the amplifier circuit 13, the regulator circuit 14 the multiplier 15, the voltage current control circuit 15 and the current detector 17 are substantially the same as those in the fourth embodiment of FIG. 8, and their explanations as applicable to this embodiment are referenced herein. Further, though the calculation result of the adder 11 is inputted to the regulator circuit 14 as in the first embodiment, the amplified result of the amplifier 13 i.e., the amplified calculation result of the adder 11, may be inputted to the regulator circuit 14 as in the second embodiment.

The three-phase AC motor 6 is driven in an open phase state or an imbalance between phase currents occurs when any switching element of the power converter 7 malfunctions, when the wiring between power converter 7 and motor 6 is broken, or when the wiring is misconnected. To solve these problems, the following test is conducted prior to driving the motor 6 to check whether the above malfunctions exist. The reference value generator circuit 10 outputs the reference phase value φ* according to which six sets of the switching elements of power converter 7 are paired to be simultaneously turned on according to the assignment listed in Table 1. The estimated primary resistance values $R_1^*$s for the six sets listed in Table 1, i.e., the output from regulator circuit 14, are stored in the phase-resistance-value storage circuit 31 with reference to each phase angle. Alternatively, one may store converted estimated primary resistance values $R_1^*$s for each phase in the phase-resistance value storage circuit 31. A resistance value comparing circuit 41 then compares the stored phase resistance values with each other and outputs resultant deviations to the comparator 42. The comparator 42 outputs an alarm signal when an input deviation exceeds a predetermined value set from a deviation setter 43.

Although the present invention has been described in connection with the foregoing embodiments and illustrations, these embodiments are merely illustrative and are not intended to be limiting. Other modifications and improvements should be readily apparent to those skilled in the art, and the present invention encompasses these modifications and improvements.

What is claimed is:

1. A method for controlling an AC motor driven by a power converter, comprising the steps of:

resolving a detected value of a current flowing through said AC motor into a magnetizing current component parallel to a magnetic flux of said AC motor and a torque current component perpendicular to said magnetic flux;

executing a control operation for equalizing said magnetizing current component to a predetermined reference magnetizing current value;

calculating at least one estimated resistance value from one of an integral operation and a proportional-plus-integral operation on deviation of said magnetizing current component from said reference magnetizing current value;

obtaining an estimated voltage drop attributable to primary resistance of the AC motor;

obtaining a reference magnetizing voltage value by adding said estimated voltage drop and result of said control operation;

controlling the power converter with said reference magnetizing voltage value; and driving said AC motor at a desired speed with AC electric power output from said power converter controlled with said reference magnetizing voltage value and a reference torque voltage value.

2. The method of claim 1 further comprising a step of varying said reference magnetizing current value from an initial large value at start-up of said AC motor to said predetermined reference magnetizing current value after a predetermined period of time has elapsed.

3. The method of claim 1, further comprising a step of calculating a mean resistance value of six estimated resistance values;

wherein said AC motor has three phases, and said six estimated resistance values are calculated from one of integral operations and proportional-plus-integral operations on deviations of said magnetizing current components from said reference magnetizing current value for sets of currents for any two phases of said three-phase AC motor supplied by actions of a first switching element on a positive side and a second switching element on a negative side of said power converter.

4. The method of claim 3, wherein the step of obtaining said estimated voltage drop through said primary resistance includes multiplying said mean resistance value and one of:

said predetermined reference magnetizing current value; and a varying reference magnetizing current value varied from an initial large value at start-up of said AC motor to said predetermined reference magnetizing current value after a predetermined period of time has elapsed.

5. The method of claim 1, wherein said AC motor has three phases, and at least three estimated resistance values are calculated from one of integral operations and proportional-plus-integral operations on deviations of said magnetizing current components from said reference magnetizing current value for each of at least three sets of currents of said two phases of said three-phase AC motor supplied by actions of a first switching element on a positive side and a second switching element on a negative side of said power converter, said method further comprising:

comparing said estimated resistance values with each other; and identifying a malfunction based on a difference between said estimated resistance values exceeding a predetermined value.

6. An apparatus for controlling an AC motor, said apparatus comprising:

current detector means for detecting a current flowing from a power converter to said AC motor;

voltage/current-control means for resolving a detected current value into a detected magnetizing current value and a detected torque current value orthogonal to each other;

first adder means for calculating a deviation between a reference magnetizing current value and said detected magnetizing current value;

amplifier means for amplifying said deviation;

regulator means for deriving a primary resistance value of said AC motor from one of said deviation and amplified value of said deviation;

multiplier means for multiplying output of said regulator means and said reference magnetizing current value; and second adder means for adding said amplified value of said deviation and output of said multiplier means.

7. The apparatus of claim 6 further comprising varying means for varying said reference magnetizing current value.

8. The apparatus of claim 7 further comprising switch means for inputting a start command to said varying means.

9. The apparatus of claim 6, wherein said AC motor has three phases, the apparatus further comprising power converter means for driving said three-phase AC motor.

10. The apparatus of claim 9, wherein said regulator means derives a plurality of primary resistance values, said regulator means further comprising:

resistance-value storage means for storing said primary resistance values;

mean-value-calculation means for calculating a mean value of said primary resistance values; and mean-resistance-value storage means for storing said mean value.

11. The apparatus of claim 10 further comprising varying means for varying said reference magnetizing current value.

12. The apparatus of claim 11 further comprising switch means for inputing start command to said varying means.

13. The apparatus of claim 10, further comprising:

resistance value comparing means for comparing said primary resistance values to each other and for outputting a resistance deviation; and comparator means for comparing a predetermined deviation and said resistance deviation and for outputting an alarm signal when said resistance deviation is larger than said predetermined deviation.

* * * * *

UNITED STATES PATENT AND TRADEMARK OFFICE
CERTIFICATE OF CORRECTION

PATENT NO. : 5,623,190

DATED : April 22, 1997

INVENTOR(S) : Tajima et al.

It is certified that error appears in the above-identified patent and that said Letters Patent is hereby corrected as shown below:

Column 4, line 34, (Equation (3) that portion of the equation reading ")$I_M$*" should read --($I_M$*--;

Column 5, line 1, "$R_1$#" should read --$R_1$--;

Column 7, line 55, "circuit" should read --circuit 32--.

Signed and Sealed this

Fourth Day of November, 1997

Attest:

BRUCE LEHMAN

Attesting Officer

Commissioner of Patents and Trademarks